United States Patent
Yoon et al.

(10) Patent No.: US 8,319,905 B2
(45) Date of Patent: Nov. 27, 2012

(54) DISPLAY SUBSTRATE HAVING QUANTUM WELL FOR IMPROVED ELECTRON MOBILITY AND DISPLAY DEVICE INCLUDING THE SAME

(75) Inventors: Kap-Soo Yoon, Seoul (KR); Sung-Hoon Yang, Seoul (KR); Sung-Ryul Kim, Cheonan-si (KR); Hwa-Yeul Oh, Seoul (KR); Jae-Ho Choi, Seoul (KR); Yong-Mo Choi, Osan-si (KR)

(73) Assignee: Samsung Display Co., Ltd. (KR)

( * ) Notice: Subject to any disclaimer, the term of this patent is extended or adjusted under 35 U.S.C. 154(b) by 847 days.

(21) Appl. No.: 12/353,152

(22) Filed: Jan. 13, 2009

(65) Prior Publication Data

US 2009/0180045 A1 Jul. 16, 2009

(30) Foreign Application Priority Data

Jan. 15, 2008 (KR) .................. 10-2008-0004464

(51) Int. Cl.
*G02F 1/1368* (2006.01)
*H01L 29/10* (2006.01)
(52) U.S. Cl. ............... 349/43; 257/43; 257/59
(58) Field of Classification Search ............. 349/42, 349/43; 257/43, 59, 72, E27.06, E29.1; 345/92
See application file for complete search history.

(56) References Cited

U.S. PATENT DOCUMENTS

| 5,496,752 | A | * | 3/1996 | Nasu et al. ............... 438/30 |
| 6,441,873 | B2 | * | 8/2002 | Young ..................... 349/43 |
| 8,101,444 | B2 | | 1/2012 | Yamazaki et al. |
| 2002/0149057 | A1 | * | 10/2002 | Kawasaki et al. ......... 257/350 |
| 2006/0255364 | A1 | * | 11/2006 | Saxler et al. ............. 257/192 |
| 2007/0138941 | A1 | * | 6/2007 | Jin et al. ................. 313/503 |
| 2009/0047760 | A1 | | 2/2009 | Yamazaki et al. |
| 2009/0057663 | A1 | * | 3/2009 | Kim et al. ................ 257/43 |

FOREIGN PATENT DOCUMENTS

CN 101409236 A 4/2009

* cited by examiner

*Primary Examiner* — Dung Nguyen
*Assistant Examiner* — Tai Duong
(74) *Attorney, Agent, or Firm* — Innovation Counsel LLP

(57) ABSTRACT

Provided are a display substrate and a display device including the same. The display substrate includes: gate wiring; a first semiconductor pattern formed on the gate wiring and having a first energy bandgap; a second semiconductor pattern formed on the first semiconductor pattern and having a second energy bandgap which is greater than the first energy bandgap; data wiring formed on the first semiconductor pattern; and a pixel electrode electrically connected to the data wiring. Because the second energy bandgap is larger than the first energy bandgap, a quantum well is formed in the first semiconductor pattern, enhancing electron mobility therein.

20 Claims, 10 Drawing Sheets

DISPLAY SUBSTRATE HAVING QUANTUM WELL FOR IMPROVED ELECTRON MOBILITY AND DISPLAY DEVICE INCLUDING THE SAME

This application claims priority from Korean Patent Application No. 10-2008-0004464 filed on Jan. 15, 2008 in the Korean Intellectual Property Office, the disclosure of which is incorporated herein by reference in its entirety.

BACKGROUND OF THE INVENTION

1. Field of the Invention

The present invention relates to a display substrate and a display device including the same. More particularly, the present invention relates to display substrates having quantum wells for improved electron mobility, and display devices including the same.

2. Description of the Related Art

Continuous efforts are being made to improve display devices by increasing display size and quality. In particular, efforts are being made to improve the electrical characteristics of thin-film transistors (TFTs) that are commonly used to drive liquid crystal displays (LCDs).

Conventional TFTs often employ a channel structure, formed with the assistance of a hydrogenated amorphous silicon (a-Si:H) pattern. Conventional TFTs that include such hydrogenated amorphous silicon have relatively low electron mobility and have problems with operational reliability due to deterioration of their electrical characteristics. Thus, continuing efforts are being made to improve TFTs, so as to improve the quality and performance of display devices.

SUMMARY OF THE INVENTION

Aspects of the present invention provide a display substrate which includes a thin-film transistor (TFT) having superior operational characteristics.

Aspects of the present invention also provide a display device with enhanced display quality.

However, aspects of the present invention are not restricted to those set forth herein. The above and other aspects of the present invention will become more apparent to one of ordinary skill in the art to which the present invention pertains by referencing the detailed description of the present invention given below.

According to an aspect of the present invention, there is provided a display substrate including: gate wiring; a first semiconductor pattern formed on the gate wiring and having a first energy bandgap; a second semiconductor pattern formed on the first semiconductor pattern and having a second energy bandgap which is greater than the first energy bandgap; data wiring formed on the first semiconductor pattern; and a pixel electrode electrically connected to the data wiring.

According to another aspect of the present invention, there is provided a display substrate including a thin film transistor comprising: a gate electrode; a first semiconductor pattern formed on the gate electrode and including amorphous silicon; a second semiconductor pattern formed on the first semiconductor pattern and including an oxide; a source electrode formed on the second semiconductor pattern; and a drain electrode formed on the second semiconductor pattern to be separated from the source electrode.

According to another aspect of the present invention, there is provided a display device including: a first display substrate; a second display substrate facing the first display substrate; and a liquid crystal layer interposed between the first display substrate and the second display substrate, wherein the first display substrate includes: gate wiring; a first semiconductor pattern formed on the gate wiring and having a first energy bandgap; a second semiconductor pattern formed on the first semiconductor pattern and having a second energy bandgap which is greater than the first energy bandgap; data wiring formed on the first semiconductor pattern; and a pixel electrode electrically connected to the data wiring.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE INVENTION

Figure 1:
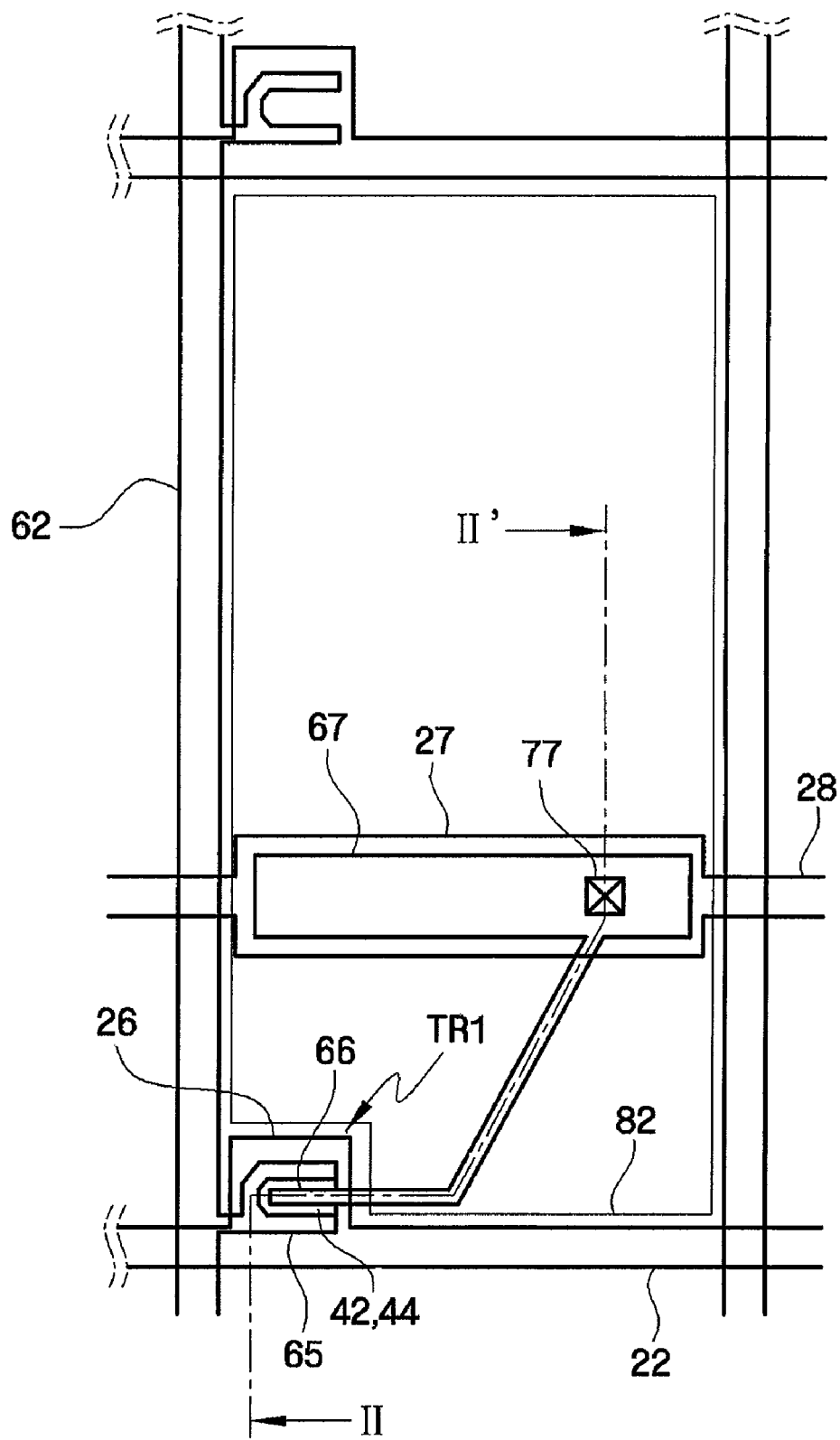
FIG. 1 is a layout diagram of a display substrate according to an embodiment of the present invention.

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art. Accordingly, the present invention will only be defined by the appended claims. In some embodiments, well-known processing processes, well-known structures and well-known technologies will not be specifically described in order to avoid ambiguous interpretation of the present invention. Like reference numerals refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, wirings, layers and/or sections, these elements, components, regions, wirings, layers and/or sections should not be limited by these terms. These terms are only used to distinguish one element, component, region, wiring, layer or section from another element, component, region, wiring, layer or section. Thus, a first element, component, region, wiring, layer or section discussed below could be termed a second element, component, region, wiring, layer or section without departing from the teachings of the present invention.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. For example, if the device in the figures is turned over, elements described as "below" or "beneath" other elements or features would then be oriented "above" the other elements or features. Thus, the exemplary term "below" or "beneath" can encompass both an orientation of above and below. The device may be otherwise oriented (rotated 90 degrees or at other orientations) and the spatially relative descriptors used herein can be interpreted accordingly.

The terminology used herein is for the purpose of describing particular embodiments only and is not intended to be limiting of the invention. As used herein, the singular forms are intended to include the plural forms as well, unless the context clearly indicates otherwise. It will be further understood that the terms "comprises" and/or "comprising," when used in this specification, specify the presence of stated components, steps, operations, and/or devices, but do not preclude the presence or addition of one or more other components, steps, operations, devices, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes or dimensions of regions illustrated herein but are to include deviations in shapes and dimensions that result, for example, from manufacturing.

For example, an implanted region illustrated as a rectangle will, typically, have rounded or curved features. Thus, the regions illustrated in the figures are schematic in nature and their shapes are not intended to illustrate the actual shape of a region of a device and are not intended to limit the scope of the invention.

Hereinafter, a case where a display device according to the present invention is a liquid crystal display (LCD) will be described as an example. However, the present invention is not limited thereto.

Figure 2:
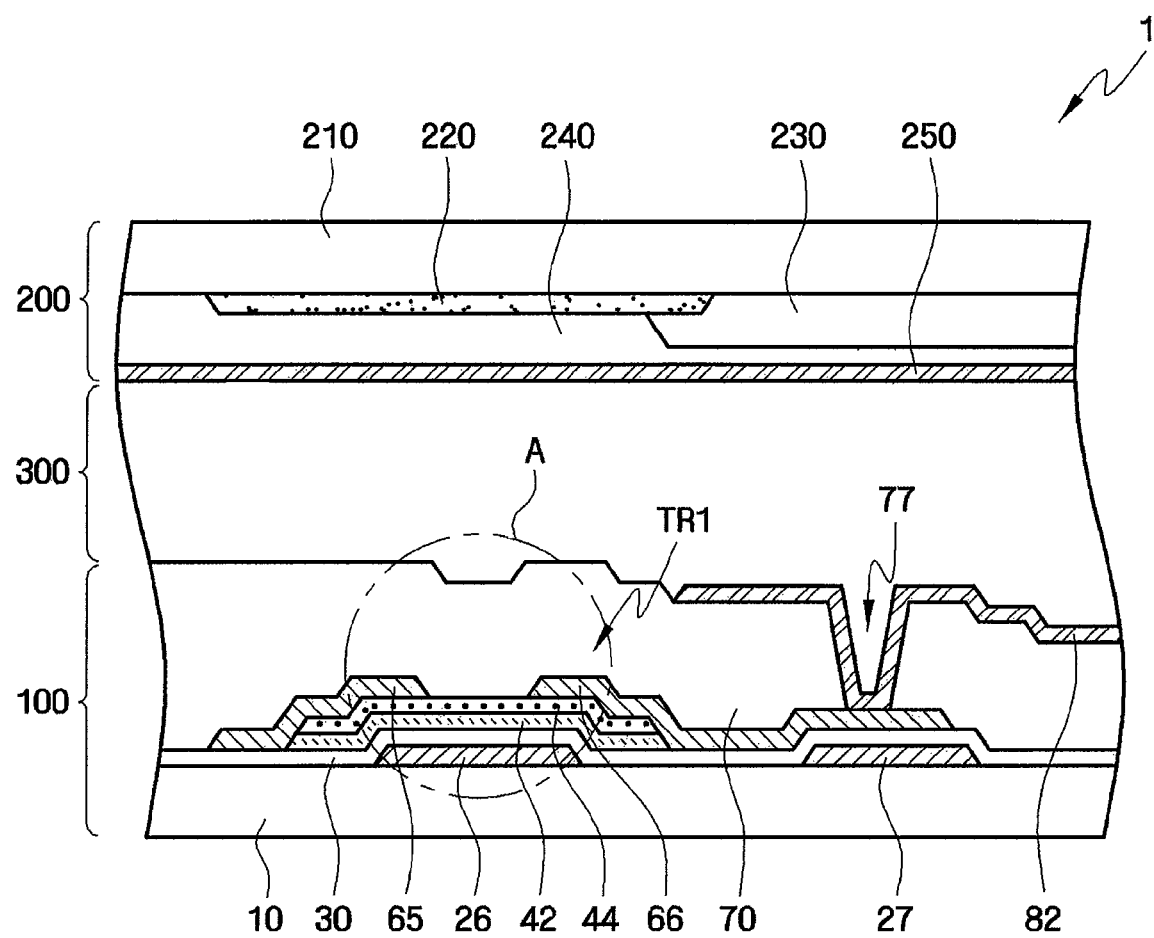
FIG. 2 is a cross-sectional view of a display device taken along a line II-II' of FIG. 1.
Figure 3A:
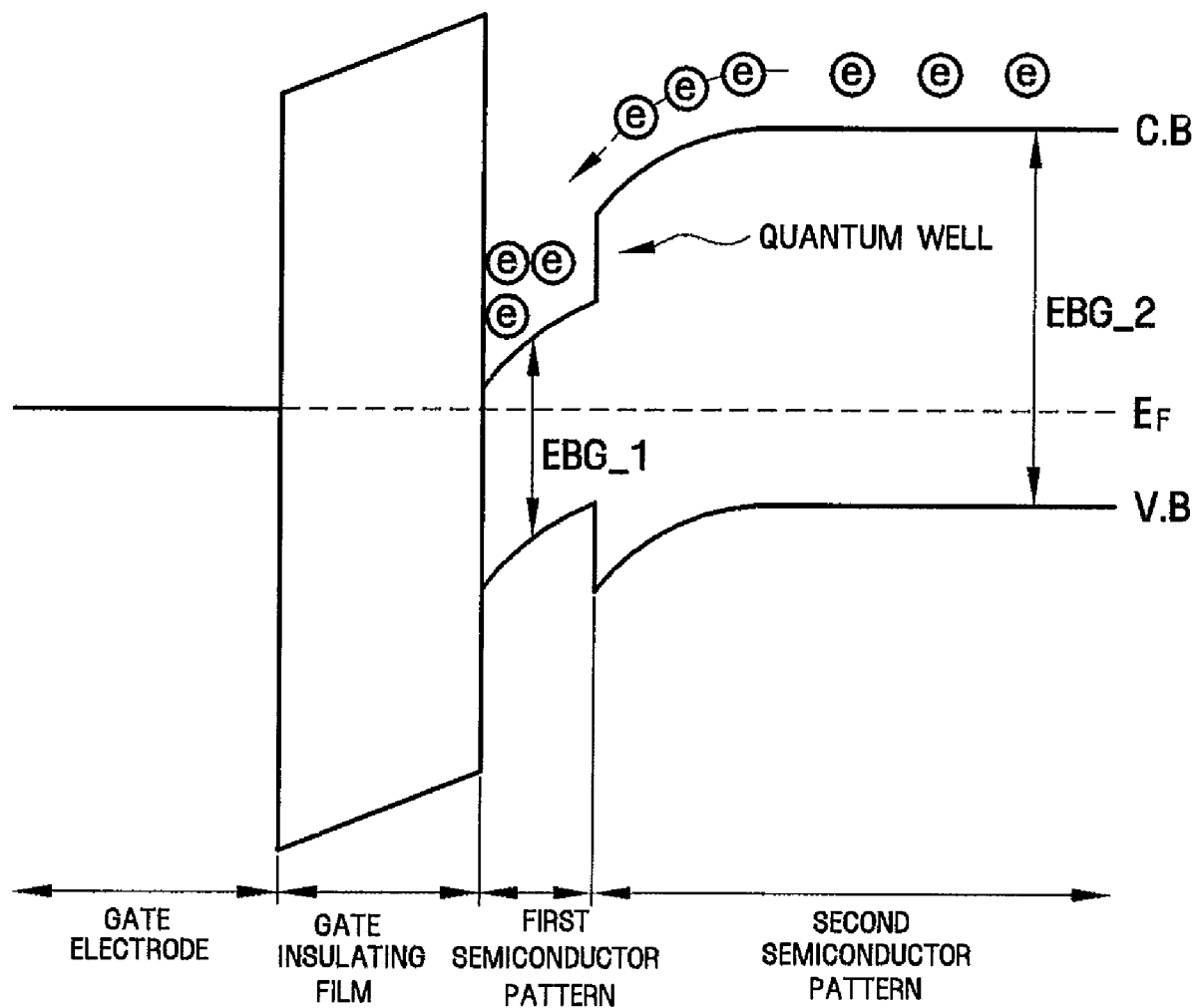
FIG. 3A is an energy band diagram for explaining the operation of a thin-film transistor (TFT) shown in FIG. 2.
Figure 3B:
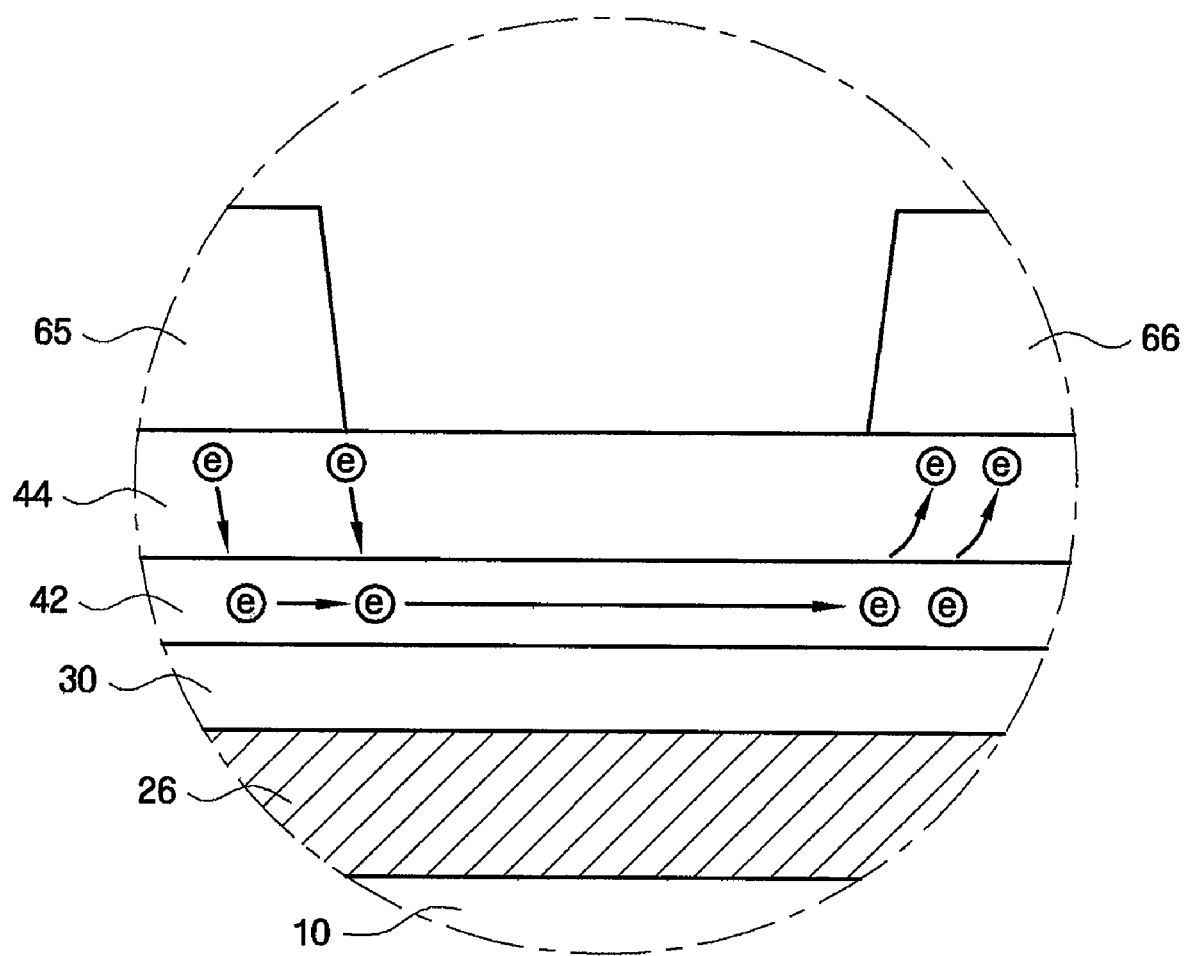
FIG. 3B is an enlarged view of portion A of FIG. 2.
Figure 4:
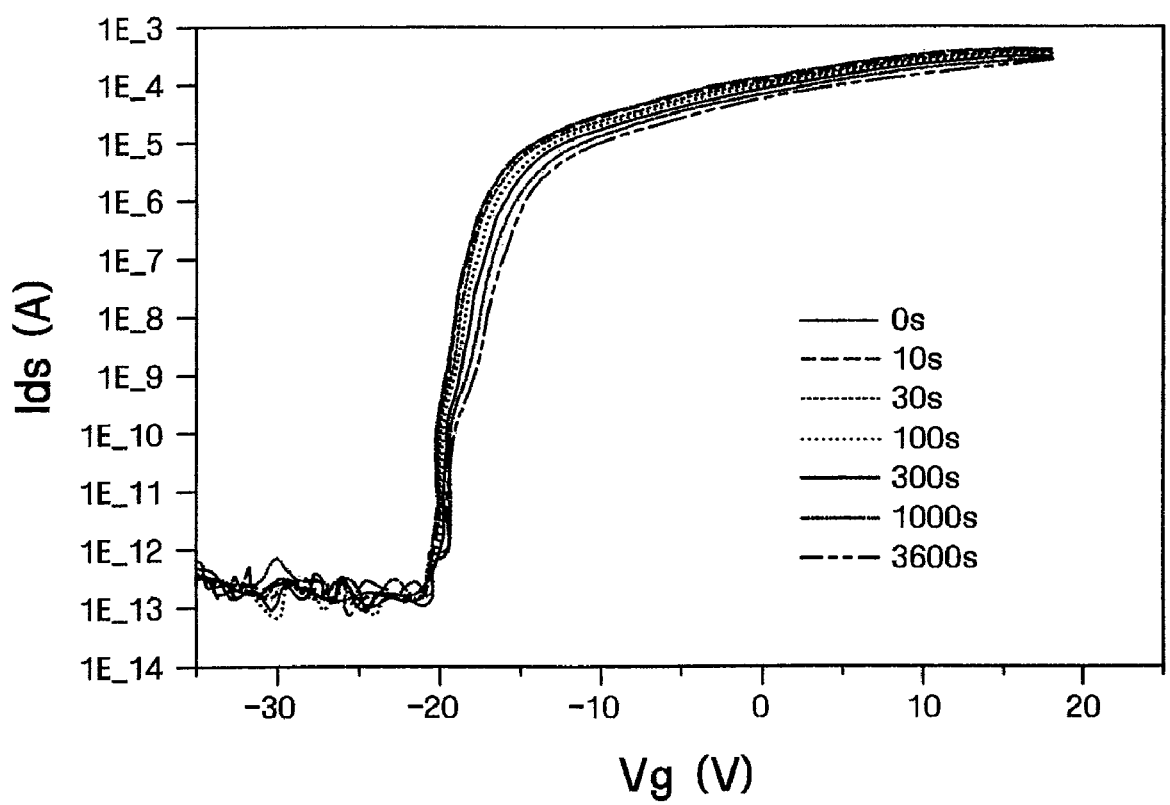
FIGS. 4 through 6 are graphs showing characteristics of the TFT of FIG. 2.
Figure 5:
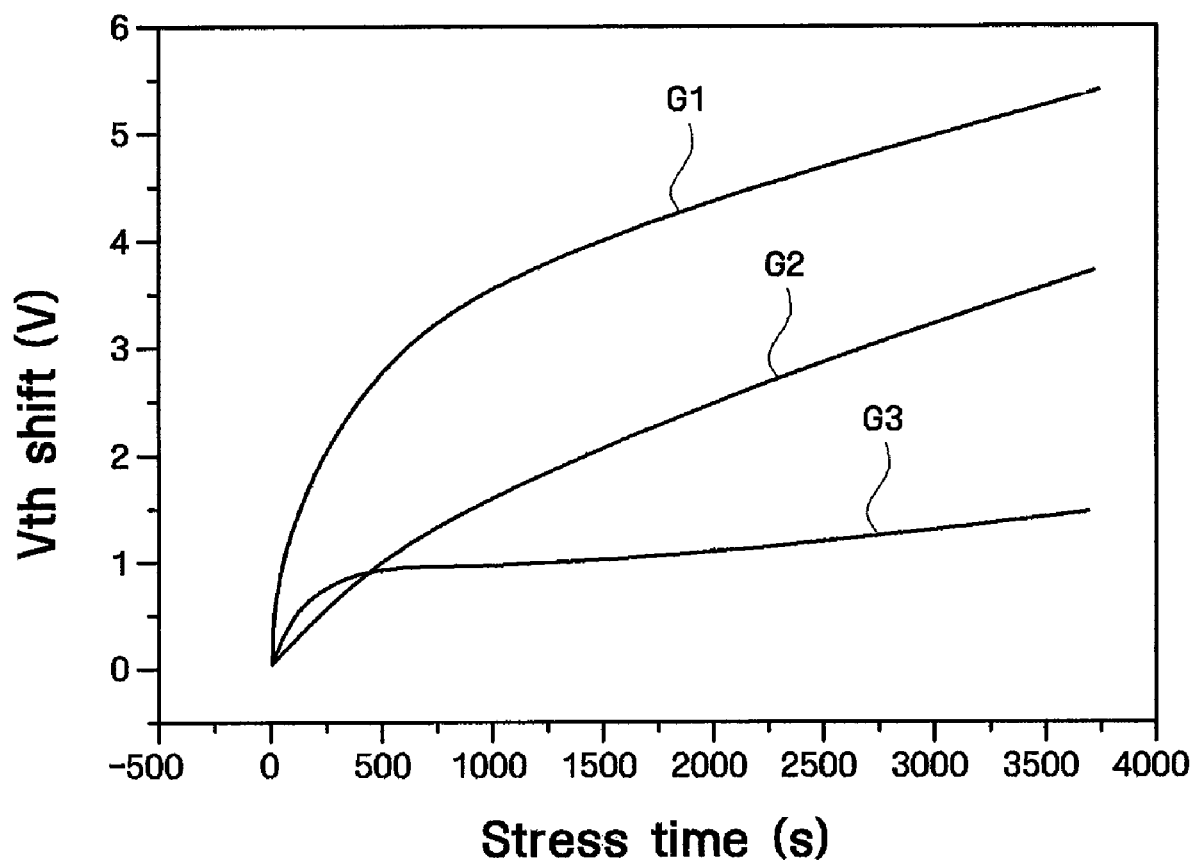
Figure 6:
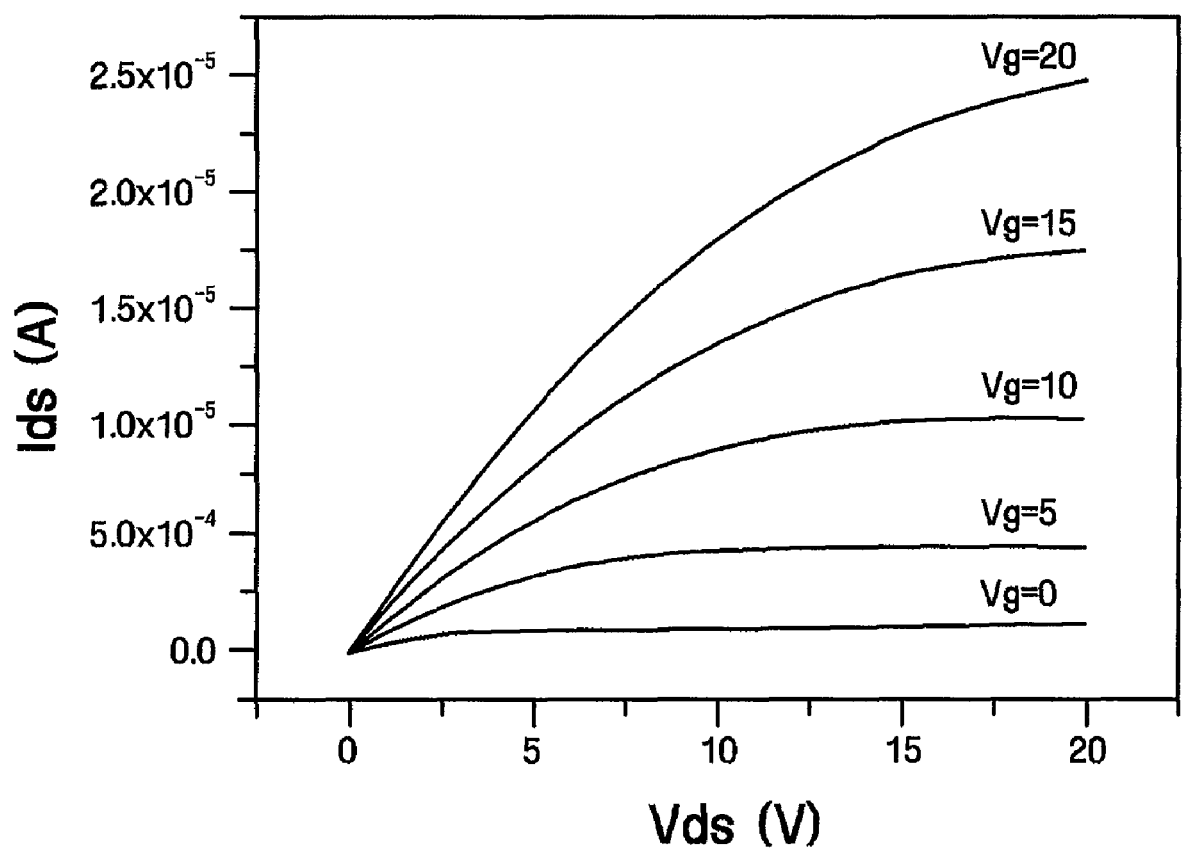

A display substrate and a display device including the same according to an exemplary embodiment of the present invention will now be described with reference to FIGS. 1 through 6. FIG. 1 is a layout diagram of a first display substrate 100 according to an embodiment of the present invention. FIG. 2 is a cross-sectional view of a display device 1 taken along a line II-II' of FIG 1. FIG. 3A is an energy band diagram for explaining the operation of a thin-film transistor (TFT) TR1 shown in FIG. 2. FIG. 3B is an enlarged view of portion A of FIG. 2. FIGS. 4 through 6 are graphs showing characteristics of the TFT TR1 of FIG. 2.

Referring to FIGS. 1 and 2, the display device 1 of the present embodiment includes the first display substrate 100, a second display substrate 200, and a liquid crystal layer 300. For simplicity, the layout of the first display substrate 100 is only shown in FIG. 1.

The first display substrate 100 will now be described below. A gate line 22 extends horizontally on an insulating substrate 10. In addition, a gate electrode 26 of the TFT TR1, which is connected to the gate line 22 and has a protruding shape, is formed on the insulating substrate 10. The gate line 22 and the gate electrode 26 are collectively referred to as gate wiring.

A storage electrode line 28 and a storage electrode 27 are also formed on the insulating substrate 10. The storage electrode line 28 extends horizontally across a pixel region and substantially parallel to the gate line 22. The storage electrode 27 is connected to the storage electrode line 28 and has a wide width. The storage electrode 27 overlaps a drain electrode extension portion 67 connected to a pixel electrode 82, which will be described later, to form a storage capacitor that improves the charge storage capability of a pixel. The storage electrode 27 and the storage electrode line 28 are collectively referred to as storage wiring.

The shape and disposition of the storage wiring may vary. In addition, if sufficient storage capacitance is generated by the overlapping of the pixel electrode 82 and the gate line 22, dedicated storage wiring need not be formed.

Each of the gate wiring and the storage wiring may be made of aluminum (Al)-based metal such as Al or Al alloys, silver (Ag)-based metal such as Ag or Ag alloys, copper (Cu)-based metal such as Cu or Cu alloys, molybdenum (Mo)-based metal such as Mo or Mo alloys, chrome (Cr), titanium (Ti), or tantalum (Ta).

In addition, each of the gate wiring and the storage wiring may have a multi-layer structure composed of two conductive layers (not shown) with different physical characteristics. In this case, one of the two conductive layers may be made of metal with low resistivity, such as Al-based metal, Ag-based metal or Cu-based metal, in order to reduce a signal delay or a voltage drop in each of the gate wiring and the storage wiring. The other one of the conductive layers may be made of a different material, in particular, a material having superior contact characteristics with indium tin oxide (ITO) and indium zinc oxide (IZO), such as Mo-based metal, chrome, titanium, or tantalum. Good examples of the multi-layer structure include a combination of a Cr lower layer and an Al upper layer and a combination of an Al lower layer and an Mo upper layer. However, the present invention is not limited thereto. The gate wiring and the storage wiring may be formed of various metals and conductors.

A gate insulating film 30, which is made of silicon nitride (SiNx), is formed on the gate wiring and the storage wiring. In addition, a first semiconductor pattern 42, which overlaps the gate electrode 26, is formed on the gate insulating film 30, and a second semiconductor pattern 44, which overlaps the gate electrode 26, is formed on the first semiconductor pattern 42.

An energy bandgap of the second semiconductor pattern 44 may be greater than that of the first semiconductor pattern 42. That is, the first semiconductor pattern 42 may form a quantum well between the gate insulating film 30 and the second semiconductor pattern 44. In this case, electron mobility within the first semiconductor pattern 42 may be enhanced, which will be described later in detail with reference to FIGS. 3A and 3B.

The first semiconductor pattern 42 may include amorphous silicon. Specifically, the first semiconductor pattern 42 may include hydrogenated amorphous silicon. The second semiconductor pattern 44 may include an oxide that contains at least one material selected from Zn, In, Ga, Sn or a combination of the same. For example, the second semiconductor pattern 44 may include a composite oxide such as InZnO, InGaO, InSnO, ZnSnO, GaSnO, GaZnO, GaInZnO, In2O3Co, TiO2Co, or MgOCo. If the semiconductor pattern includes only an oxide, the electrical characteristics of the TFT may be deteriorate by an oxygen defect. But, if the first semiconductor pattern 42 includes amorphous silicon and if the second semiconductor pattern 44 includes an oxide, the electrical characteristics of the TFT TR1 do not deteriorate Thus, the TFT TR1 can have superior stability and operational reliability. In addition, the display quality of the display device 1 can be enhanced. A more detailed description will be made later with reference to FIGS. 4 through 6.

Data wiring is formed on the first and second semiconductor patterns 42 and 44 and the gate insulating film 30. The data wiring includes a data line 62, a source electrode 65, a drain electrode 66 and the drain electrode extension portion 67. The data line 62 extends vertically and crosses the gate line 22, thereby defining a pixel. The source electrode 65 branches off from the data line 62 and extends onto the first and second semiconductor patterns 42 and 44. The drain electrode 66 is separated from the source electrode 65 and formed on the first and second semiconductor patterns 42 and 44 to face the source electrode 65. The drain electrode extension portion 67 has a portion that extends from the drain electrode 66 and overlaps the storage electrode 27.

The data wiring may directly contact the second semiconductor pattern 44 to form an ohmic contact. In order to form the ohmic contact with the oxide semiconductor patterns, the data wiring may have a single-layer structure or a multi-layer structure including Ni, Co, Ti, Ag, Cu, Mo, Al, Be, Nb, Au, Fe, Se or Ta. Examples of the multi-layer structure may include a double-layered structure, such as, Ta/Al, Ni/Al, Co/Al or Mo (Mo alloy)/Cu, or a triple-layered structure such as Ti/Al/Ti, Ta/Al/Ta, Ti/Al/TiN, Ta/Al/TaN, Ni/Al/Ni or Co/Al/Co. The material of the data wiring is not limited to the above materials. In addition, the data wiring may not directly contact the second semiconductor pattern 44, and an ohmic contact layer (not shown) may further be interposed between the data wiring and the second semiconductor pattern 44 for improved ohmic contact.

The source electrode 65 at least partially overlaps the gate electrode 26, and the drain electrode 66 at least partially overlaps the gate electrode 26 to face the source electrode 65. The gate electrode 26, the first semiconductor pattern 42, the second semiconductor pattern 44, the source electrode 65, and the drain electrode 66 collectively form the TFT TR1.

The drain electrode extension portion 67 overlaps the storage electrode 27, and thus the drain electrode extension portion 67 and the storage electrode 27 form a storage capacitor with the gate insulating film 30 interposed therebetween. When the storage electrode 27 is not formed, the drain electrode extension portion 67 need not be formed.

A passivation layer 70 is formed on the data wiring and the first and second semiconductor patterns 42 and 44. The passivation layer 70 may be made of, for example, an inorganic material such as silicon nitride or silicon oxide, an organic material having photosensitivity and superior planarization characteristics, or a low-k dielectric material formed by plasma enhanced chemical vapor deposition (PECVD), such as a-Si:C:O or a-Si:O:F. The passivation layer 70 may be composed of a lower inorganic layer and an upper organic layer in order to protect an exposed portion of the second semiconductor pattern 44 while taking advantage of the superior characteristics of an organic layer.

A contact hole 77 exposing the drain electrode extension portion 67 is formed in the passivation layer 70.

The pixel electrode 82 is disposed on the passivation layer 70. The pixel electrode 82 is electrically connected to the drain electrode extension portion 67 by the contact hole 77. The pixel electrode 82 may be made of, for example, a transparent conductor, such as ITO or IZO, or a reflective conductor such as Al.

The second display substrate 200 will now be described below. A black matrix 220 for preventing leakage of light is formed on an insulating substrate 210. The black matrix 220 is formed in regions other than the pixel region, thereby defining the pixel region. The black matrix 220 may be made of, for example, an opaque organic material or an opaque metal.

For color representation, red (R), green (G) and blue (B) color filters 230 are formed on the insulating substrate 210. Each of the R, G and B color filters 230 absorbs or passes light in a predetermined wavelength band by using R, G or B pigments included therein in order to represent R, G or B color. The R, G and B color filters 230 may generate various colors by additively mixing R, G and B light that passes therethrough.

An overcoat layer 240 may be formed on the black matrix 220 and the R, G and B color filters 230 in order to planarize their step heights. The overcoat layer 240 can be made of a transparent organic material, protects the black matrix 220 and the R, G and B color filters 230, and insulates a common electrode 250, which will be described later, from the black matrix 220 and the R, G and B color filters 230.

The common electrode 250 is formed on the overcoat layer 240. The common electrode 250 may be made of a transparent conductive material, such as ITO or IZO.

The liquid crystal layer 300 is interposed between the first display substrate 100 and the second display substrate 200. The voltage difference between the pixel electrode 82 and the common electrode 250 determines transmittance.

The TFT TR1 shown in FIGS. 1 and 2 will now be described in more detail with reference to FIGS. 3A and 3B.

FIG. 3A is an energy band diagram showing energy bands of the gate electrode 26, the gate insulating film 30 and the first and second semiconductor patterns 42 and 44 when a positive voltage, that is, a gate-on voltage, is applied to the gate electrode 26. In FIG. 3A, a first energy bandgap EBG_1 is an energy difference between a conduction band C.B and a valence band V.B of the first semiconductor pattern 42, and a second energy bandgap EBG_2 is an energy difference between the conduction band C.B and the valence band V.B of the second semiconductor pattern 44. In addition, reference character $E_F$ indicates a Fermi energy level. Since the Fermi energy level is widely known in the field of semiconductors, a detailed description thereof will be omitted.

As described above, the first semiconductor pattern 42 has the first energy bandgap EBG_1, and the second semiconductor pattern 44 has the second energy bandgap EBG_2 which is greater than the first energy bandgap EBG_1. Therefore, a quantum well is formed between the gate insulating film 30 and the second semiconductor pattern 44, that is, in the first semiconductor pattern 42. That is, as shown in FIGS. 3A and 3B, an energy barrier at the boundary between the first and second semiconductor patterns 42 and 44 makes it difficult for electrons in the first semiconductor pattern 42 to move from the first semiconductor pattern 42 to the second semiconductor pattern 44. Accordingly, the first semiconductor pattern 42 may have high electron mobility therein. If the thickness of the first semiconductor pattern 42 is approximately 200 Å or less, the width of the quantum well may be reduced, thereby making it more difficult for electrons to move to the second semiconductor pattern 44. Accordingly, the electron mobility within the first semiconductor pattern 42 may further be enhanced. However, in the present invention, the thickness of the first semiconductor pattern 42 is not limited to approximately 200 Å or less.

As described above, the first semiconductor pattern 42 may include hydrogenated amorphous silicon, and the second semiconductor pattern 44 may include an oxide. The electron mobility of the TFT TR1 of the first display substrate 100 according to the present embodiment and that of other forms of TFTs are summarized in the following table.

TABLE 1

| No. | Form | Mobility (cm$^2$/Vsec) |
|---|---|---|
| 1 | Oxide | 3 |
| 2 | Hydrogenated amorphous silicon | 0.5 |
| 3 | Laminated structure of hydrogenated amorphous silicon and oxide | 6 |

Referring to Table 1, a semiconductor pattern of a TFT at number one includes an oxide but does not include hydrogenated amorphous silicon, and a semiconductor pattern of a TFT at number two includes hydrogenated amorphous silicon but does not include an oxide. A TFT at number three is an example of the TFT TR1 shown in FIGS. 1 and 2. That is, the number three TFT includes a first semiconductor pattern, which contains amorphous silicon, and a second semiconductor pattern which contains an oxide. If a width to length ratio (W/L ratio) of the semiconductor pattern of each TFT is 25/4, the electron mobility of the number one TFT is 3 cm$^2$/Vsec, that of the number two TFT is 0.5 cm$^2$/Vsec, and that of the number three TFT is 6 cm$^2$/Vsec. That is, if a TFT includes the first semiconductor pattern 42 and the second semiconductor pattern 44 as in the present embodiment and if a quantum well is formed in the first semiconductor pattern 42, electron mobility can be significantly enhanced.

Other characteristics of the TFT TR1 will now be described in more detail with reference to FIGS. 4 through 6. The following description is based on data obtained after characteristics of the TFT TR1 were tested. The tested TFT TR1 includes the first semiconductor pattern 42, which is hydrogenated amorphous silicon, and the second semiconductor pattern 44 which is an oxide. In addition, the thickness of the first semiconductor pattern 42 is approximately 100 Å, and that of the second semiconductor pattern 44 is approximately 700 Å.

In order to obtain the data of FIG. 4, a gate voltage Vg of 20 V was applied to the gate electrode 26, and a gate voltage of 10 V was applied to the source electrode 65 by varying the test time. Then, drain-source current Ids for the gate voltage Vg was measured.

As shown in FIG. 4, when the TFT TR1 includes a first semiconductor pattern 42 made of hydrogenated amorphous silicon and a second semiconductor pattern 44 made of an oxide, an I-V curve hardly shifts even if the test time is increased.

In order to obtain the data of FIG. 5, a gate voltage Vg of 20 V was applied to a gate electrode of each of TFTs Nos. 1 through 3 in Table 1, and a gate voltage Vg of 10 V was applied to a source electrode thereof. Then, a threshold voltage was measured at each test time. A first curve G1 indicates a threshold voltage of the TFT at No. 2 in Table 1, a second curve G2 indicates a threshold voltage of the TFT at No. 1 in Table 1, and a third curve G3 indicates a threshold voltage of the TFT at No. 3 in Table 1.

As shown in FIG. 5, in the case of the TFT, No. 3 in Table 1, including a first semiconductor pattern 42 of hydrogenated amorphous silicon and a second semiconductor pattern 44 made of an oxide, the threshold voltage hardly changes even if the test time is increased.

In summary, the TFT TR1, which has a first semiconductor pattern 42 of hydrogenated amorphous silicon and a second semiconductor pattern 44 made of an oxide, has superior stability and operational reliability.

FIG. 6 shows data on the relationship between drain-source current Ids and a drain-source voltage Vds with respect to the variation in the gate voltage Vg. Referring to FIG. 6, even when the drain-source voltage Vds is low, for example, 0 V to 5 V, the drain-source current Ids varies according to the gate voltage Vg. That is, little current crowding occurs. Therefore, even when the drain-source voltage Vds is low, a drain-source current Ids corresponding to each drain-source voltage Vds is still generated and provided to the pixel electrode 82. In this manner, allowing the drain-source current Ids to be controlled by a small drain-source voltage Vds allows for more precise control of the voltage of the pixel electrode 82, thereby enhancing display quality of the display device 1.

Figure 7:
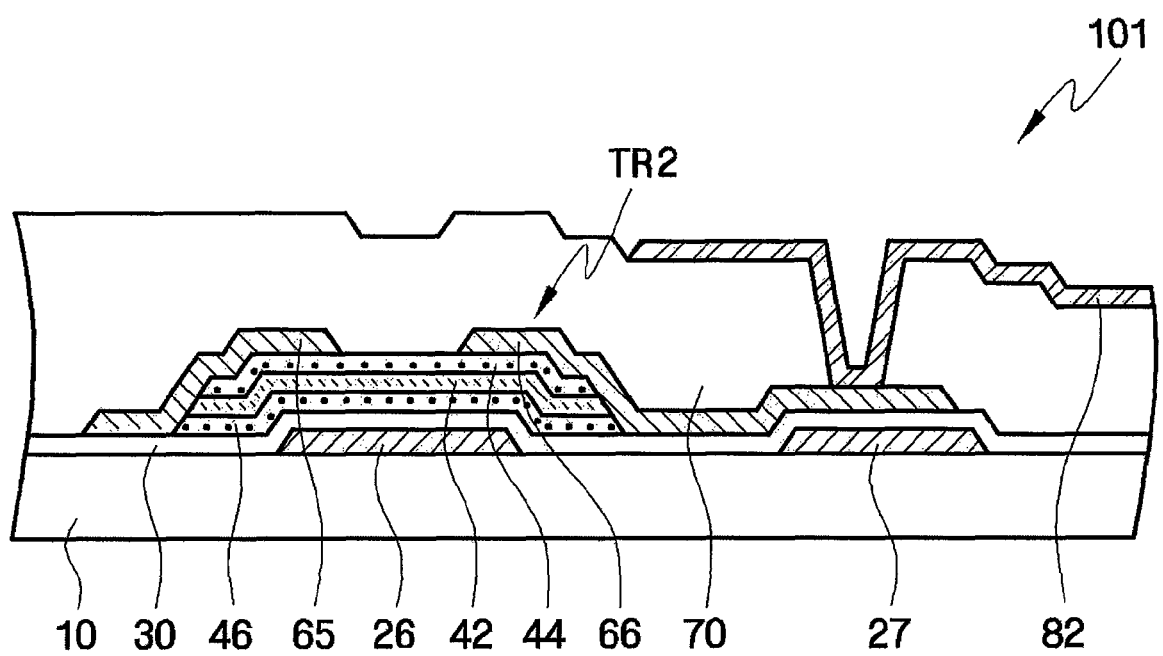
FIG. 7 is a cross-sectional view of a first display substrate according to another exemplary embodiment of the present invention.

Another exemplary embodiment of the present invention will now be described with reference to FIG. 7. FIG. 7 is a cross-sectional view of a first display substrate 101 for explaining a display substrate, and a display device including the same, according to another exemplary embodiment of the present invention. Elements substantially identical to those of the previous embodiment described above with reference to FIG. 2 are indicated by like reference numerals, and thus their description will be omitted.

Referring to FIG. 7, unlike in the previous embodiment, the first display substrate 101 according to the present embodiment further includes a third semiconductor pattern 46. The third semiconductor pattern 46 may be formed between a gate insulating film 30 and a first semiconductor pattern 42. The semiconductor pattern 46 may have a third energy bandgap which is greater than a first energy bandgap EBG1 of the first semiconductor pattern 42. In this case, a quantum well may be formed between a second semiconductor pattern 44 and the third semiconductor pattern 46, that is, in the first semiconductor pattern 42. Thus, electron mobility in the first semiconductor pattern 42 can be enhanced.

The third semiconductor pattern 46 may include an oxide. For example, the third semiconductor pattern 46 may include a composite oxide such as InZnO, InGaO, InSnO, ZnSnO, GaSnO, GaZnO, GaInZnO, In2O3Co, TiO2Co, or MgOCo. If the first display substrate 101 further includes the third semiconductor pattern 46, the gate insulating film may be omitted. That is, the third semiconductor pattern 46 may function as the gate insulating film 30 and may be formed directly on a gate electrode 26.

Since a TFT TR2 of the first display substrate 101 according to the present embodiment includes the first semiconductor pattern 42 and the second semiconductor pattern 44, stability, operational reliability and display quality can be enhanced as described above in the previous embodiment with reference to FIGS. 4 through 6.

Figure 8:
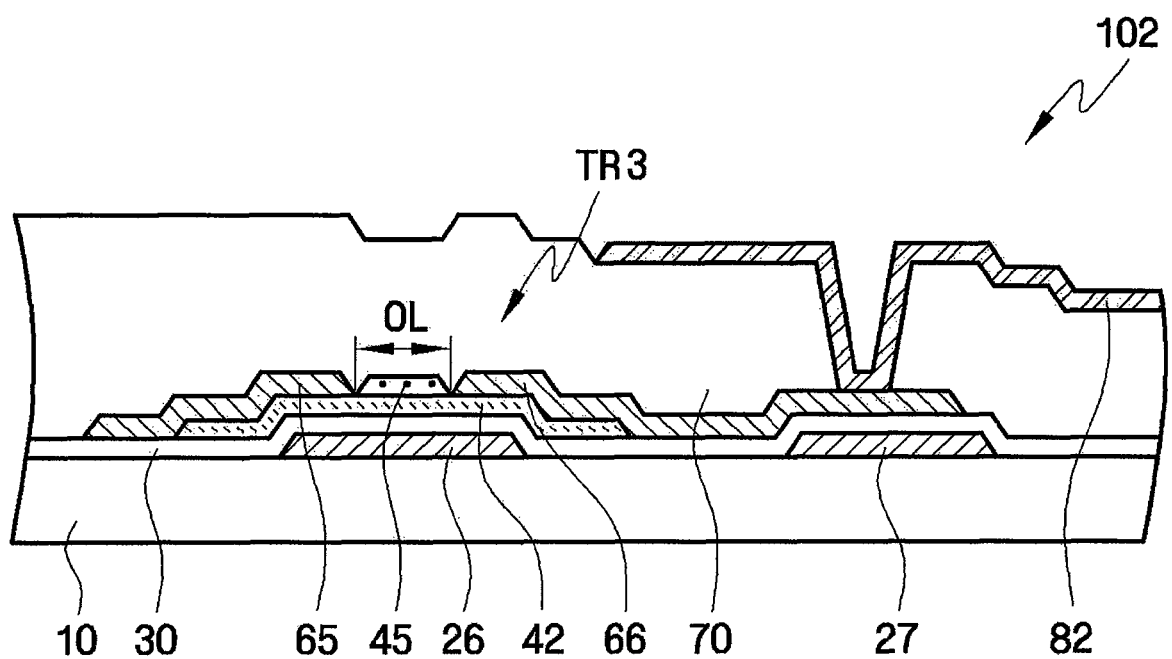
FIG. 8 is a cross-sectional view of a display substrate according to another exemplary embodiment of the present invention.

Another exemplary embodiment of the present invention will now be described with reference to FIG. 8. FIG. 8 is a cross-sectional view of a first display substrate 102 for explaining a display substrate, and a display device including the same, according to another exemplary embodiment of the present invention. Elements substantially identical to those of the previous embodiment described above with reference to FIG. 2 are indicated by like reference numerals, and thus their description will be omitted.

Referring to FIG. 8, unlike in the previous embodiments, a second semiconductor pattern 45 of the first display substrate 102 according to the present embodiment partially overlaps a first semiconductor pattern 42. For example, the second semiconductor pattern 45 may be formed between a source electrode 65 and a drain electrode 66. In addition, the second semiconductor pattern 45 may not overlap the source electrode 65 and the drain electrode 66.

In this case, an energy band as shown in FIG. 3A is formed in an overlap region OL of the first semiconductor pattern 42, where the first semiconductor pattern 42 and the second semiconductor pattern 45 overlap each other. In this manner, a quantum well may be formed in the overlap region OL, enhancing electron mobility in this region. The presence of this quantum well provides enhanced stability, operational reliability and display quality, as described above in the previous embodiment with reference to FIGS. 4 through 6.

Figure 9:
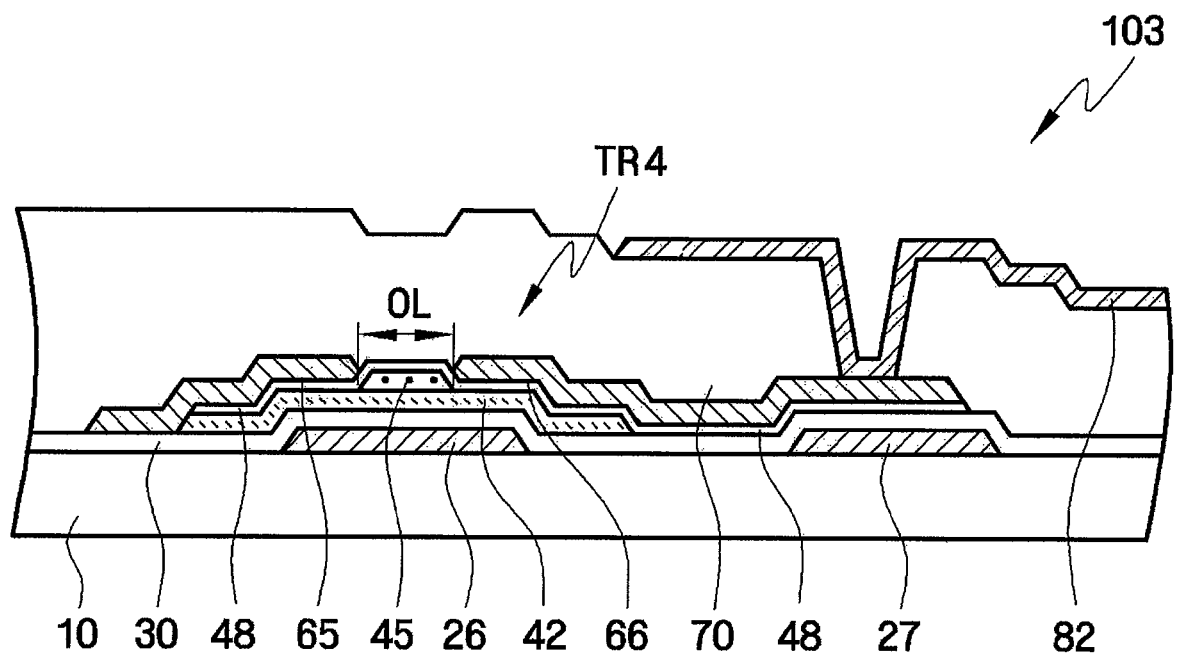
FIG. 9 is a cross-sectional view of a display substrate according to another exemplary embodiment of the present invention.

A further exemplary embodiment of the present invention will now be described with reference to FIG. 9. FIG. 9 is a cross-sectional view of a first display substrate 103 for explaining a display substrate, and a display device including the same, according to another exemplary embodiment of the present invention. Elements substantially identical to those of the previous embodiment described above with reference to FIG. 2 are indicated by like reference numerals, and thus their description will be omitted.

Referring to FIG. 9, unlike in the previous embodiments, the first display substrate 103 may further include an ohmic contact layer 48 on first and second semiconductor patterns 42 and 45. That is, the second conductor pattern 45 overlaps the first semiconductor pattern 42 in an overlap region OL, and the ohmic contact layer 48 is formed between source and drain electrodes 65 and 66 and the first semiconductor pattern 42. In this case, electron mobility in the overlap region OL can be enhanced by a quantum well, formed by patterns 42 and 45 as described above. In addition, the ohmic contact between the source and drain electrodes 65 and 66 and the ohmic contact layer 48 improves ohmic characteristics, thereby enhancing the electron mobility. The ohmic contact layers 48 are made of, for example, n+hydrogenated amorphous silicon, which is doped with n-type impurities in high concentration, and reduce contact resistance between the source and drain electrodes 65 and 66 disposed thereon and first and second semiconductor patterns 42 and 45 disposed thereunder.

Since a TFT TR4 of the first display substrate 103 according to the present embodiment includes the first semiconductor pattern 42 and the second semiconductor pattern 45, stability, operational reliability and display quality can be enhanced as described above in the previous embodiment with reference to FIGS. 4 through 6.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A display substrate comprising:
   gate wiring;
   a first semiconductor pattern formed on the gate wiring and having a first energy bandgap;
   a second semiconductor pattern formed on the first semiconductor pattern, wherein the second semiconductor pattern comprises an oxide and has a second energy bandgap which is greater than the first energy bandgap;
   data wiring formed on the first semiconductor pattern; and
   a pixel electrode electrically connected to the data wiring.

2. The display substrate of claim 1, wherein the second semiconductor pattern is disposed under the data wiring and forms an ohmic contact with the data wiring.

3. The display substrate of claim 1, wherein the second semiconductor pattern comprises O and at least one of Ga, In, Zn, Sn, Co, Ti and Mg.

4. The display substrate of claim 1, wherein the first semiconductor pattern comprises amorphous silicon.

5. The display substrate of claim 1, further comprising a third semiconductor pattern formed between the gate wiring and the first semiconductor pattern and having a third energy bandgap which is greater than the first energy bandgap, wherein the display device is configured to form a quantum well in the first semiconductor pattern.

6. The display substrate of claim 1, further comprising a gate insulating film formed between the gate wiring and the first semiconductor pattern, wherein a quantum well is formed in the first semiconductor pattern.

7. The display substrate of claim 1, further comprising an ohmic contact layer disposed on the first semiconductor pattern and forming an ohmic contact with the data wiring.

8. The display substrate of claim 1, wherein a thickness of the first semiconductor pattern is approximately 200 Å or less.

9. A display substrate including a thin film transistor comprising:
   a gate electrode;
   a first semiconductor pattern formed on the gate electrode and comprising amorphous silicon;
   a second semiconductor pattern formed on the first semiconductor pattern and comprising an oxide;
   a source electrode formed on the second semiconductor pattern; and
   a drain electrode formed on the second semiconductor pattern and separated from the source electrode.

10. The display substrate of claim 9, wherein the second semiconductor pattern forms an ohmic contact with each of the source electrode and the drain electrode.

11. The display substrate of claim 9, wherein the first semiconductor pattern has a first energy bandgap, and the second semiconductor pattern has a second energy bandgap which is greater than the first energy bandgap.

12. The display substrate of claim 9, further comprising a gate insulating film formed between the gate wiring and the first semiconductor pattern, wherein a quantum well is formed in the first semiconductor pattern.

13. The display substrate of claim 9, wherein the second semiconductor pattern comprises O and at least one of Ga, In, Zn, Sn, Co, Ti and Mg.

14. The display substrate of claim 9, wherein a thickness of the first semiconductor pattern is approximately 200 Å or less.

15. A display device comprising:
   a first display substrate;

a second display substrate facing the first display substrate; and a liquid crystal layer interposed between the first display substrate and the second display substrate, wherein the first display substrate comprises:

gate wiring;

a first semiconductor pattern formed on the gate wiring and having a first energy bandgap;

a second semiconductor pattern formed on the first semiconductor pattern, wherein the second semiconductor pattern comprises an oxide and has a second energy bandgap which is greater than the first energy bandgap;

data wiring formed on the first semiconductor pattern; and a pixel electrode electrically connected to the data wiring.

16. The display device of claim 15, wherein the second semiconductor pattern is disposed under the data wiring and forms an ohmic contact with the data wiring.

17. The display device of claim 15, wherein the second semiconductor pattern comprises O and at least one of Ga, In, Zn, Sn, Co, Ti and Mg.

18. The display device of claim 15, wherein the first semiconductor pattern comprises amorphous silicon.

19. The display device of claim 15, further comprising a third semiconductor pattern formed between the gate wiring and the first semiconductor pattern and having a third energy bandgap which is greater than the first energy bandgap, wherein the display device is configured to form a quantum well in the first semiconductor pattern.

20. The display device of claim 15, wherein a thickness of the first semiconductor pattern is approximately 200 Å or less.

* * * * *